United States Patent [19]

Ramaprasad

[11] Patent Number: 4,882,233
[45] Date of Patent: Nov. 21, 1989

[54] SELECTIVELY DEPOSITED ELECTRODES ONTO A SUBSTRATE

[75] Inventor: K. R. Ramaprasad, Princeton, N.J.

[73] Assignee: Chronar Corp., Lawrenceville, N.J.

[21] Appl. No.: 157,843

[22] Filed: Feb. 19, 1988

Related U.S. Application Data

[63] Continuation of Ser. No. 615,248, May 30, 1984, abandoned.

[51] Int. Cl.⁴ .................................................. B23C 3/02
[52] U.S. Cl. ...................................... 428/620; 148/33; 437/8; 437/170; 437/203
[58] Field of Search ..................... 148/334; 428/620; 437/170, 203, 8

[56] References Cited

U.S. PATENT DOCUMENTS

| | | | |
|---|---|---|---|
| 4,189,826 | 2/1980 | Smith | 437/181 |
| 4,277,517 | 7/1981 | Smith, Jr. | 427/96 |
| 4,332,075 | 6/1982 | Ota et al. | 437/181 |
| 4,387,116 | 6/1983 | Bucker | 427/230 |
| 4,570,332 | 2/1986 | Yamaguchi | 437/170 |
| 4,675,467 | 6/1987 | Van Dine et al. | 437/8 |

Primary Examiner—Upendra Roy
Attorney, Agent, or Firm—George E. Kersey

[57] ABSTRACT

A conductive substrate for the deposition of material thereon which comprises an insulating layer upon said substrate, and a pluralitry of aperatures in said insulating layer containing conductive material formed from said substrate forming a plurality of metallic nucleating centers for the adherence of said material to said substrate.

8 Claims, 2 Drawing Sheets

SELECTIVELY DEPOSITED ELECTRODES ONTO A SUBSTRATE

This is a continuation of Ser. No. 615,248 filed May 30, 1984, now abandoned.

BACKGROUND OF THE INVENTION

This invention relates to the deposition of materials on substrates, and, more particularly, to the electrodeposition of metals and semiconductors on substrates.

It is often desirable to form a layer of material such as a metal or a semiconductor upon a substrate. The substrate is typically a support for the overlying layer of material. In some cases the substrate and deposited material are part of a composite device.

The deposit of materials on substrates is widely practiced by electroless coating processes which are time consuming. Alternatively the coating may take place by electrodeposition, but this procedure does not produce a strongly adherent deposit. Strong adherence is particularly important with substrates that are used in liquid crystal displays and solar photovoltaic cells. Examples of substrates are conductive glass, such as tin oxide or indium tin oxide coated glass. In these cases the electrical contact between the deposited material and the conductive glass must not only be strongly adherent but also rapidly achievable.

Accordingly, it is an object of the invention to facilitate the deposition of materials on substrates. A related object is to facilitate the deposition of metallic and semiconductive materials on conductive substrates, such as conductive glass, or doped semiconductors.

Another object of the invention is to expedite the production of materials deposited on substrates such as conductive glass. A related object is to simplify the sequence of processing steps. A related object is to shorten the production time interval.

Still another object of the invention is to enhance the degree of adherence achieved between a deposited material and an underlying substrate. A related object is to enhance the conductive contact between a deposited material and an associated substrate.

SUMMARY OF THE INVENTION

In accomplishing the foregoing and related objects, the invention provides for the electropolishing of a surface of a substrate on which material is to be deposited. The surface is desirably a non-metallic conductive substrate, and the material that is to be deposited is ionic in solution. The deposition of the ionic material upon the substrate takes place after electropolishing has been completed.

In accordance with one aspect of the invention, the electropolishing desirably takes place in an acid bath in which the substrate is acid stable and acts as an electrode. The substrate is a cathode and the acid bath is formed by a water-diluted solution of concentrated acid. The voltage at the cathode advantageously is adjusted to provide hydrogen evolution which polishes the substrate surface. In the case of a non-metallic conductive oxide, the polishing produces metallic centers. In the case of metal and doped semiconductors, the polishing cleans the surface by the removal of surface oxygen.

In accordance with a further aspect of the invention, the material to be deposited is a metal or semiconductor. The acid of the bath is selected from the class including phosphoric, sulfuric, and the like. The electropolishing removes surface oxides and exposes pure substrate.

The product produced in accordance with the invention has a plurality of metallic centers on at least one surface of a non-metallic conducting substrate. The metallic centers permit the adherent electrodeposition of material. The metallic centers desirably are uniformly distributed on the surface containing them, and are formed by the electrolytic reduction of non-metallic conductive material. The substrate may include a conductive metallic oxide, in which case the desired metallic centers are formed by the surface reduction of conductive metal oxide to pure metal. The metal oxide is selected from the class of materials including tin oxide, indium tin oxide and variations.

In accordance with yet another aspect of the invention, an electro-deposited laminate which is produced includes a non-metallic conductive substrate with metallic centers formed by the reduction of non-metallic conductive material. Material is electro-deposited upon the substrate where it adheres at the surface metallic centers. The electro-deposited material is selected from the class of metals and semiconductors.

DESCRIPTION OF THE DRAWINGS

Other aspects of the invention will become apparent after considering several illustrative embodiments, taken in conjunction with the drawings in which.

DETAILED DESCRIPTION

Figure 1A:
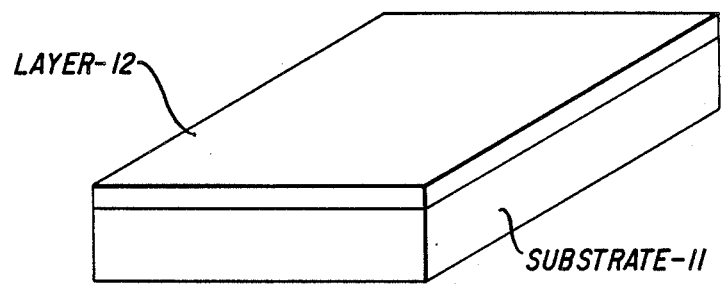
FIG. 1A is a perspective view of a final laminate in accordance with the invention.

With reference to the drawings, FIG. 1A shows a laminate 10 formed by a substrate 11 and an overlying layer 12.

The substrate 11 is illustratively a non-metallic conductor, such as a conductive metal oxide, and the layer 12 can be a conductive material such as copper, nickel or a non-metallic material such as a semiconductor like cadmium selenide or cadnium telluride. A suitable metal oxide for the substrate 11 is tin oxide, indium tin oxide or variations.

Figure 1B:
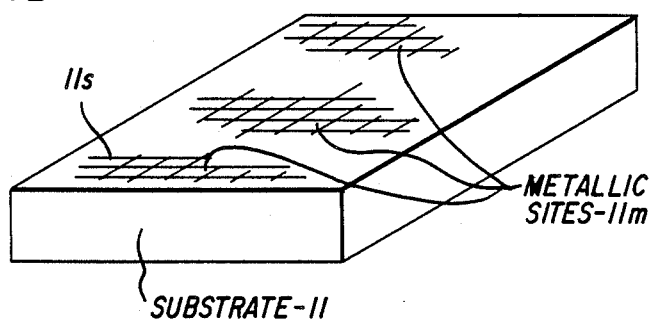
FIG. 1B is a perspective view of a substrate with prepared metallic sites for receiving the metallic or electrodeposited layer of FIG. 1A.

As shown in FIG. 1B, the substrate 11 has a surface 11s with a plurality of sites 11m. When the substrate is a conductive metal oxide, the sites 11m are metallic nucleation centers. Otherwise the sites 11m are centers of freshly exposed material. The sites 11m are established by electropolishing in accordance with the invention as illustrated in, for example, FIG. 2.

Figure 2:
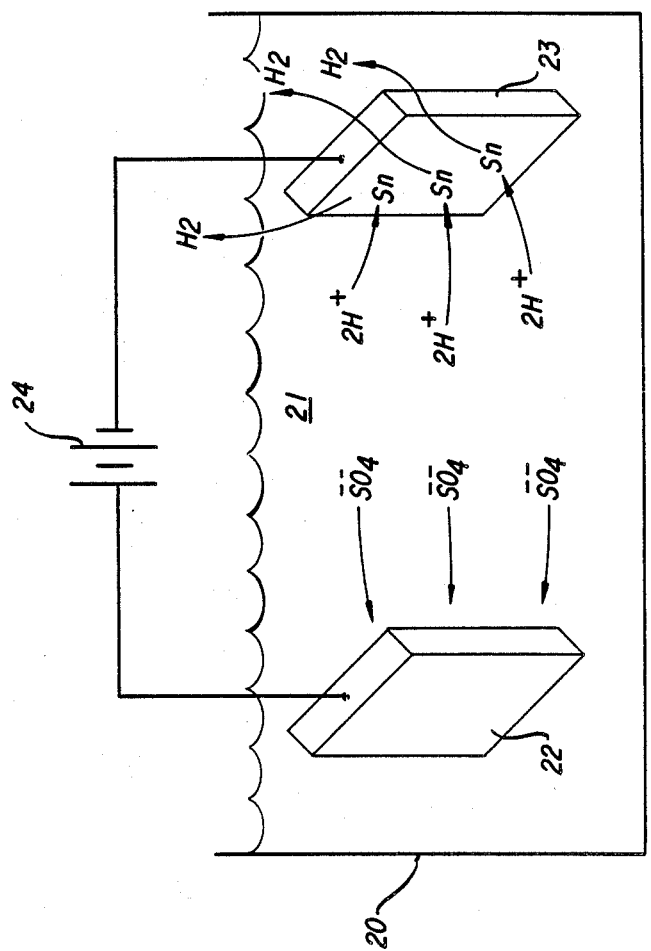
FIG. 2 is a schematic view of an acid bath for the electropolishing of a surface in accordance with the invention.

FIG. 2 shows a container 20 with an acid bath 21. The acid of the bath 21 is selected from such acidic materials as phosphoric, sulfuric, and other similar acids. The bath 21 includes electrodes 22 and 23. These electrodes are in circuit through the bath 21 with a D.C. energizing source 24. The electrode 23, which is a cathode by virtue of its connection to a negative pole of the battery 24, can be a metallic oxide, such as tin oxide.

When the bath 21 is in operation the cations of the acid, namely hydrogen ions, migrate to the cathode 23. Upon their arrival at the cathode 23, the cations are discharged and produce a polishing effect on the surface that exposes sites of pure tin (Sn) in the case of tin oxide. Otherwise the sites are centers of cleaning. The cathode gives up electrons to the hydrogen ions which are converted into hydrogen gas, shown escaping from the bath 21, that serves as the polishing agent.

The chemical equation that applies to the reaction is shown below the container 20 of FIG. 2.

As noted previously the voltage of the battery 24 and the strength of the electrolyte 21 are adjusted to produce a current flow associated with the commencement of evolution of hydrogen gas from the bath. It will be appreciated that the settings may be such that the operation is above the threshold of hydrogen evolution. In general the preferred operation is at the threshold.

The number of sites 11$m$ produced on the impact surface of the cathode 23 is controlled by the time and current density of exposure. The higher these parameters, the more numerous are the sites. Once a sufficient number of sites has been produced by an optimized process, the cathode 23 is removed from the bath 21 and subjected, after washing to the application of an overlying layer which binds to the sites.

The overlying layer may be metallic to produce the structure of FIG. 1A or may be semiconductive. In addition, the layer imposed upon the substrate 23 may be produced by electrodeposition in which case the electrolyte is replaced by a metallic salt whose cations in solution migrate to the cathode and produce the desired electro-deposited layer. Or the overlying layer may be applied in any other convenient way.

While various aspects of the invention have been set forth by the drawings and specification, it is to be understood that the foregoing detailed description is for illustration only and that various changes in parts, as well as the substitution of equivalent constituents for those shown and described may be made without departing from the spirit and scope of the invention as set forth in the appended claims.

What is claimed is:

1. A conductive substrate for the deposition of material thereon, which comprises an insulating layer upon said substrate; and a plurality of apertures in said insulating layer containing conductive material formed from said substrate forming a plurality of metallic nucleating centers for the adherence of said material to said substrate.

2. A substrate as defined in claim 1 wherein said centers are uniformly distributed on said one surface.

3. A substrate as defined in claim 1 wherein said centers are formed by the electrolytic reduction of conductive material on said substrate.

4. A substrate as defined in claim 1 wherein said substrate includes a conductive metal oxide and said metallic centers are formed by the surface reduction of said conductive metal oxide to pure metal.

5. A substrate as defined in claim 1 which is metallic or semiconductive.

6. A substrate as defined in claim 4 wherein said metal oxide is selected from the class including tin oxide, indium tin oxide and variations thereof.

7. A laminate of material and a substrate which comprises a conductive substrate wherein at least one surface of said substrate includes nucleating centers formed by the reduction of non-metallic conductive material; and a material deposited upon said substrate and adherent thereto at the surface nucleating centers thereof.

8. A laminate as defined in claim 7 wherein the deposited material is selected from the class of metals and semiconductors; and the substrate is selected from the class of metals and semiconductors.

* * * * *